United States Patent [19]

Sher

[11] 4,084,101
[45] Apr. 11, 1978

[54] APPARATUS FOR CONVERTING RADIANT ENERGY TO ELECTRIC ENERGY

[76] Inventor: Arden Sher, 108 Charles River Landing Rd., Williamsburg, Va. 23185

[21] Appl. No.: 631,689

[22] Filed: Nov. 13, 1975

[51] Int. Cl.² .............................................. H01G 7/04
[52] U.S. Cl. ................................... 290/1 R; 250/336; 361/282
[58] Field of Search .............................. 317/246–248; 250/338, 336; 290/1

[56] References Cited

U.S. PATENT DOCUMENTS 3,480,777  11/1969  Astheimer ............................. 317/247
3,657,644   4/1972  Beam et al. ........................... 317/247

OTHER PUBLICATIONS

Solomon, Sher & Muller, Polarization In$LaF_3$, vol. 37, No. 9, of Journal of Applied Physics, pp. 3427–3432, Aug. '66.

Sher, Solomon, Lee & Muller, Transport Properties of $LaF_3$, vol. 144, No. 2 of Physical Review, pp. 593–604, Apr. '66.

Primary Examiner—Robert K. Schaefer
Assistant Examiner—John W. Redman
Attorney, Agent, or Firm—Lowe, King, Price & Markva

[57] ABSTRACT

Radiant energy is converted into electric energy by irradiating a capacitor including an ionic dielectric having a dipole layer only on or near its surface. The dielectric is selected from the group consisting of the rare earth trifluorides and trichlorides, and is preferably lanthanum trifluoride or lanthanum trichloride. The radiant energy cyclically heats and cools the dielectric to cause cyclic changes in the capacitance and resistance of the capacitor without changing the dielectric state. The capacitor is initially charged to a voltage just below the dielectric breakdown voltage by temporarily connecting it across a source of emf causing a current to flow through a charging resistor to the dielectric. The device can be utilized as a radiant energy detector.

30 Claims, 10 Drawing Figures

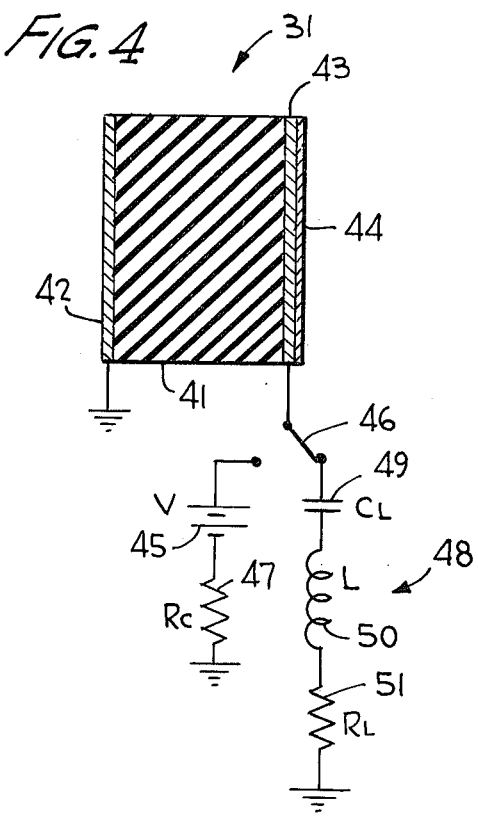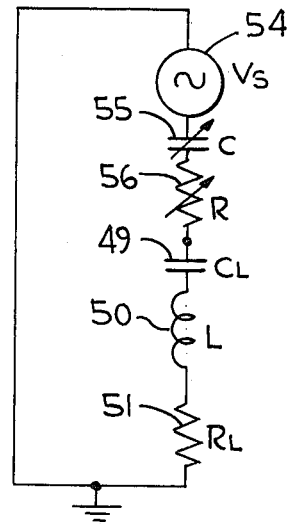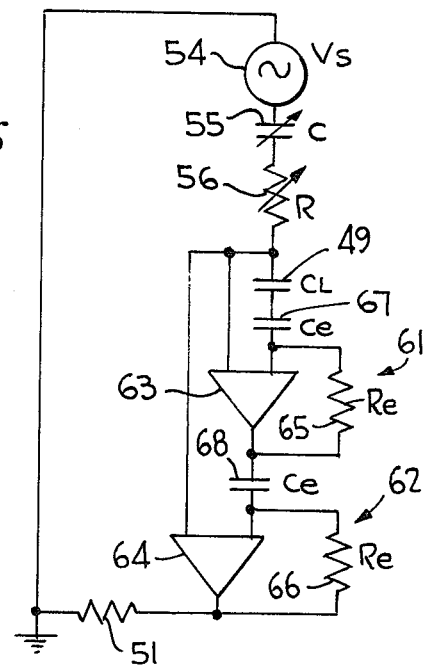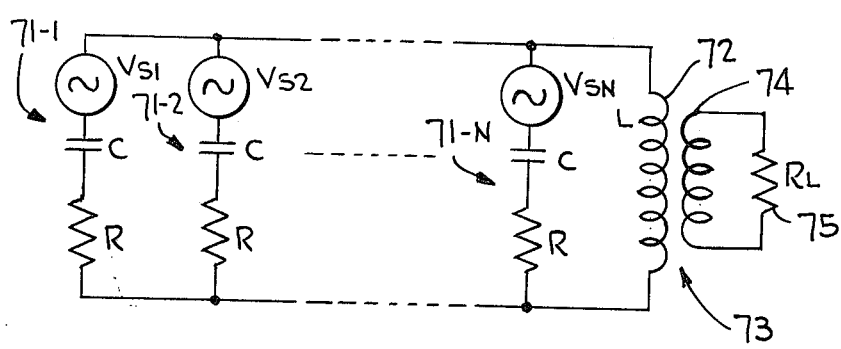

APPARATUS FOR CONVERTING RADIANT ENERGY TO ELECTRIC ENERGY

ORIGIN OF THE INVENTION

The invention claimed herein was reduced to practice during the course of a grant from the National Aeronautics and Space Administration, and the Government of the United States is therefore entitled to a non-exclusive, royalty-free license of the subject matter claimed herein.

FIELD OF INVENTION

The present invention relates generally to apparatus for converting radiant energy into electrical energy and more particularly a pyroelectric apparatus including an ionic dielectric having a dipolar layer only on or near the dielectric surface.

BACKGROUND OF THE INVENTION

Devices for converting radiant energy, such as optical energy, into electric energy presently generally take two forms; viz: (1) semiconductors relying upon a barrier layer mechanism, and (2) pyroelectric devices wherein a ferroelectric is cyclically heated and cooled to provide corresponding changes in the capacitance and resistance of a capacitor including the ferroelectric.

Typically, the barrier layer semiconductor devices have relatively heavily doped semiconductor layers. These devices are utilized as radiant, optical energy detectors for specific wavelengths of interest, as well as power generating solar cells. The major disadvantage of the semiconductor devices as radiant energy detectors is that the semiconductor element must be maintained at cryogenic temperatures to function effectively. It is frequently difficult to maintain a semiconductor device at a cryogenic temperature, whereby the usefulness of semiconductor radiant energy detectors is frequently limited.

Pyroelectric devices are generally characterized by a ferroelectric dielectric that is positioned between a pair of electrodes to form a capacitor responsive to the optical energy. Typically, the ferroelectric material is periodically heated and cooled to cause a periodic variation in the capacitance and resistance of the capacitor. Since the ferroelectric materials have dipole layers extending completely through the dielectric, i.e., from one electrode to the other electrode, the dielectrics are strongly piezoelectric, making them sensitive to vibrations. Thereby, the pyroelectric detectors have a tendency to be noisy and frequently have relatively low signal to noise ratio outputs. In addition, the pyroelectric detectors often have detectivities below the level of the radiation impinging on the dielectric, thereby limiting their application in many systems.

BRIEF DESCRIPTION OF THE INVENTION

In accordance with the present invention, radiant energy is converted into electric energy with a pyroelectric device including an ionic dielectric of the type having a dipole layer only on or near its surface in proximity to an electrode. Preferably, the dielectric is a single crystal formed from the group consisting of the rare earth trifluorides and trichlorides; lanthanum trifluoride is the preferred compond forming the dielectric. It is to be understood, however, that any rare earth trifluoride or trichloride that would replace lanthanum would suffice and that, therefore, the invention is applicable for the rare earths having atomic number from 57 through 64, i.e., the rare earths consisting of lanthanum, cerium, praseodymium, neodymium, samarium, europium, and gadolinium. The electrical properties of lanthanum trifluoride have been extensively investigated and are discussed in the Physical Review Vol. 44, No. 2, pps. 593–604, Apr. 15, 1966, Sher et al, and in Journal of Applied Physics, Vol. 37, No. 9, pps. 3427–3432, August, 1966, Solomon et al. As discussed in the Journal of Applied Physics article, single crystal lanthanum trifluoride is an ionic conductor exhibiting unusually large polarization effects, evidently associated with surface effect dipole layers, in contrast to the prior art ferroelectric ionic conductors wherein a dipole layer extends completely through the ferroelectric material. When the materials of interest are fully charged, they break down at a predetermined voltage, generally between 5 and 10 volts, regardless of the thickness between the electrodes which are applying the voltage, because all of the field is applied across a surface layer having a thickness on the order of 1 to 2 microns, i.e., the capacitor has a Debye shielding length on the order of 1 to 2 microns.

The dielectrics utilized with the present invention have been found to exhibit a strongly temperature sensitive ionic conductivity and surface polarization capacitance when employed as a dielectric sandwiched between a pair of electrodes to form a capacitor. In particular, the capacitance, C, and resistance, R, of the capacitor are exponential functions of temperature in accordance with:

$$C = C_o e^{-E_c/kT} \quad (1)$$

$$R = R_o e^{+E_r/kT} \quad (2)$$

where:

$C_o$ = static capacitance of the capacitor at high temperature, i.e., $KT >> E_c$, $R_o$ = the static, series resistance of the capacitance at high temperature, i.e., $kT >> E_r$, $E_c$ = the activation energy for the temperature dependent capacitance of the capacitor, $E_r$ = the activation energy of the temperature dependent resistance of the capacitor, $k$ = Boltzmann's constant, and $T$ = temperature in degrees Kelvin.

The values of $E_r$ and $E_c$ are determined by the particular material. For lanthanum trifluoride, $E_r$ equals approximately 0.49eV and $E_c$ equals approximately 0.5eV. The capacitance and resistance represented by Equations 1 to 2 are preferably cyclically varied by cyclically varying the radiant energy impinging on the dielectric, thereby to cyclically vary the temperature of the dielectric. Hence, as the temperature of the dielectric increases, the capacitor capacitance and resistance respectively increase and decrease. The capacitance and resistance variations indicated by Equations 1 and 2 are exponential relationships while the dielectric material is maintained in the same phase, without undergoing any Curie point phase transition. In fact a phase transition has never been observed in lanthanum trifluoride.

The device of the present invention is ideally suited as a radiant energy detector for frequencies extending from the upper edge of the microwave range to the infra-red. In particular, since the capacitance of the dielectric is dominated by a surface phenomenon, the effective dielectric volume that must be heated to modulate or vary the capacitance of the dielectric may be much less than the entire volume of the dielectric. However, even if the whole volume must be heated, because of the high gain factor (about 20 at $T = 300°$ K), relatively small changes in the temperature of the dielectric in response to a particular wavelength of interest result in relatively large capacitance changes to provide a relatively high sensitivity and detectivity for the device. Further, increases in the ambient temperature of the dielectric reduce the series resistance of the capacitor to enhance the noise characteristics and increase sensitivity. Therefore, it is preferable to operate the device at a relatively high temperature, on the order of 400° K; based on observations at lower temperatures a lanthanum trifluoride detector operating at this temperature would have a detectivity (D*) of approximately $5 \times 10^9$ Hertz[1] cm per watt. While increasing the temperature of the device increases, rather than decreases, the signal to noise ratio of the output signal, such temperature changes do not have an appreciable effect on the RC time constant of the device. This is particularly true of lanthanum trifluoride wherein RC is virtually independent of T, since $E_c$ equals approximately $E_r$.

When the device is utilized as a detector, the capacitor is connected via a series, blocking capacitor in circuit with a load having a relatively large resistive impedance. The capacitor responsive to radiant energy is initially charged by a suitable D.C. source to a voltage sufficient to cause a current to flow in a charging resistor without breaking down the dielectric. Thereby, in response to relatively low amplitude variations of the radiant energy to be detected, the capacitance variations of the radiant energy responsive capacitor cause a maximum voltage to be developed across the load. These voltage variations are easily detected with appropriate amplifying circuitry.

It is, accordingly, an object of the present invention to provide a new and improved device for converting radiant energy into electric energy.

Another object of the invention is to provide a new and improved radiant energy detector.

A further object of the invention is to provide a new and improved pyroelectric radiant energy detector.

Yet another object of the invention is to provide a pyroelectric radiant energy detector wherein noise is minimized by heating the pyroelectric element to a temperature in excess of room temperature.

A further object of the invention is to provide a new and improved pyroelectric radiant energy detector having improved sensitivity.

Yet another object of the invention is to provide a pyroelectric device for converting radiant energy into electrical energy, wherein the device employs a dielectric having a dipole only on or near the dielectric surface.

The above and still further objects, features and advantages of the present invention will become apparent upon consideration of the following detailed description of several specific embodiments thereof, especially when taken in conjunction with the accompanying drawing.

BRIEF DESCRIPTION OF THE DRAWING

FIG. 4 is a circuit diagram of one of the cells illustrated in FIG. 3 and the circuit with which it is connected;

FIG. 5 is an equivalent circuit diagram of the circuit illustrated in FIG. 4;

FIGS. 6 and 7 are circuit diagrams of alternative circuits that can be utilized to achieve resonating means in the circuit of FIG. 4.

DETAILED DESCRIPTION OF THE DRAWING

Figure 1:
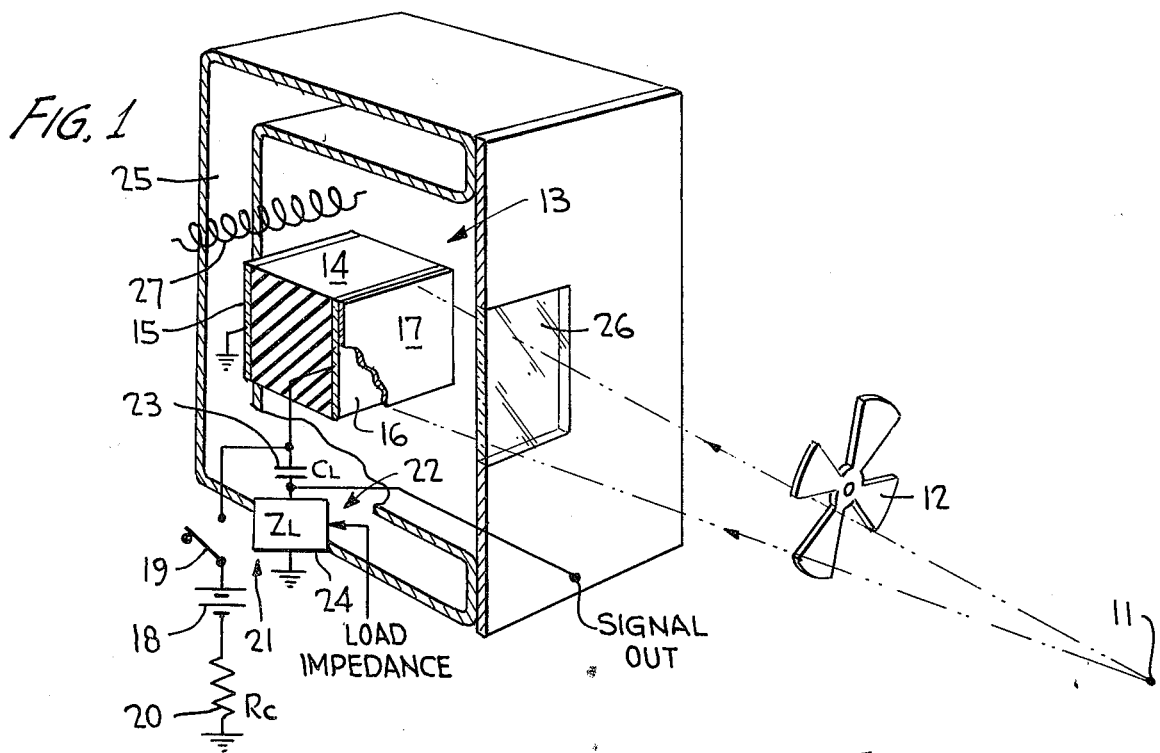
FIG. 1 is a schematic diagram of one embodiment of a detector in accordance with the present invention.

Reference is now made to FIG. 1 of the drawing wherein radiant energy from a suitable source 11, which may have a wavelength anywhere from the ultraviolet to microwave frequencies, is cyclically interrupted by chopper 12 so that the energy illuminates pyroelectric detector 13. In the preferred embodiment, source 11 is in the infra red range and chopper 12 is rotated at a constant rate so that radiation from source 11 impinges on the detector at a predetermined, constant frequency. Detector 13 is a variable capacitor including a solid dielectric 14 on which are coated relatively thin, electrically conducting, metal contacts or electrodes 15 and 16. On electrode 16 which faces source 11, there is a thin radiation absorbing layer 17 that absorbs a wavelength or spectrum of interest from source 11 to periodically heat and cool dielectric 14. For wide band detector applications, layer 17 may be a black coating of paint on electrode 16. However, if dielectric material 14 has a strong absorption band for the frequency interval of interest absorbing layer 17 can be eliminated. Electrode 16 is so thin that temperature variations on layer 17 resulting from modulation of source 11 are coupled with virtually no attenuation to dielectric 14.

Prior to the device being put into operation, a charge is established across dielectric 14, between electrodes 15 and 16. To this end, electrode 16 is initially connected to D.C. source 18 through switch 19 and current limiting resistor 20. The circuit is completed by connecting source 18 and resistor 20 to ground, as well as by connecting electrode 15 to ground. The voltage of source 18 is selected such that there is no breakdown of dielectric 14 when the voltage is applied between electrodes 15 and 16. However, it is desirable to provide as high an initial voltage as possible between electrodes 15 and 16, without achieving breakdown, so that a substantial current can be derived from detector 13 in response to the periodic heating and cooling of dielectric 14 by the chopped radiation from source 11.

After the initial voltage has been applied across dielectric 14 by D.C. source 18, switch 19 is opened and current is supplied by detector 13 to an external load circuit 21 in response to the alternate heating and cooling of the dielectric. Switch 19 is opened to prevent noise generated by D.C. source 18 from being coupled to the detector while the device is in operation. Load circuit 21 includes a relatively large blocking capacitor 23, connected in series between electrode 16 and resistive load impedance 24 to prevent discharge of detector 13, that is series connected to electrode 15 via a ground connection. Load impedance 24 has a relatively large, resistive value so that maximum voltage can be developed across it and applied to input terminals of an AC amplifier (not shown) that drives a synchronous detector (not shown) responsive to the frequency of the chopped radiation from source 11.

The apparatus so far described in connection with FIG. 1 is generally known, and is frequently referred to as a pyroelectric detector. In accordance with one aspect of the present invention, there is employed a class of materials for dielectric 14 that has not, to my knowledge, been utilized previously in a pyroelectric detector. In particular, dielectric 14 is a class of materials having a dipole layer only on or near its surface in contact with electrodes 15 and 16; generally the dipole layer extends into dielectric to a depth on the order of 1 to 2 microns. This is in contrast to prior art pyroelectric detectors which utilize ferroelectrics wherein a dipole layer extends completely through the dielectric material between the opposite electrodes of the capacitor. In particular, the rare earth trifluorides and trichlorides exhibit strongly temperature sensitive ionic conductivity, as well as surface polarizaton capacitance because they have a dipole layer only on or near the surface of the dielectric in proximity to an electrode. Lanthanum trifluoride (LaF$_3$) has been found to be quite acceptable as a dielectric 14. It is to be understood, however, that other rare earths which can replace lanthanum could be employed; these rare earths extend from atomic number 58 through atomic number 64 and include cerium, praseodymium, neodymium, samarium, europium and gadolinium (lanthanum has an atomic number of 57).

In one device that has been actually fabricated, the lanthanum fluoride dielectric 14 has a thickness of approximately 100 microns between silver electrodes 15 and 16 which were deposited by vacuum vapor techniques on opposite surfaces of the dielectric to a thickness between 0.1 to 0.5 microns. However, the dielectric thickness can be any suitable distance and generally is in the range from 5 to 100 microns.

In response to the alternate heating and cooling of dielectric 14 in response to the chopped radiation from source 11 impinging on layer 17, the capacitance and resistance of the detector are varied as given supra by Equations 1 and 2. From Equation 2, it is seen that the resistance of detector 13 decreases with increasing temperature. Therefore, it is desirable to raise the ambient temperature of detector 13 to provide maximum detectivity and sensitivity. It has been found that an ambient temperature of detector 13 on the order of 400° K enables the detector of the present invention to function in an optimum manner. If the temperature is in excess of 400° K, there is no further substantial decrease in resistivity, due to the approach of the asymptotic effect of the exponential variation. In addition, temperatures in excess of 400° K. excite optical vibrations in the detector to actually possibly increase the specific heat and decrease the sensitivity. To enable the device to be maintained at an ambient temperature of approximately 400° K. and maximize the thermal time constant of the device, detector 13 is placed in an evacuated Dewar 25 having a window 26 transparent to the radiant energy of source 11 or of the wavelength desired to be detected. Within Dewar 25 an electric heater 27 is provided to maintain detector 13 at a temperature of approximately 400° K.

Figure 2:
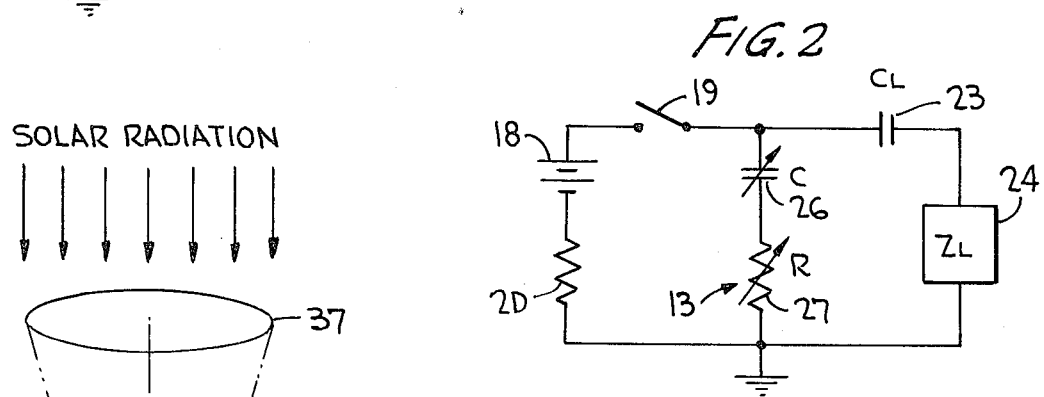
FIG. 2 is an equivalent circuit diagram of the detector illustrated in FIG. 1.

In FIG. 2, there is illustrated an equivalent circuit diagram for the device illustrated in FIG. 1. In the circuit of FIG. 2, detector 13 is represented by a series circuit including variable capacitor 26 and variable resistor 27, which are shunted across the series combination of capacitor 23 and load impedance 24. Capacitor 26 and resistor 27 respond to the cyclic heating and cooling of detector 13 in accordance with Equations 1 and 2 supra. Since the activation energies $E_c$ and $E_r$ are respectively approximately equal to 0.5 eV and 0.49 eV for lanthanum trifluoride, the values of $E_r$ and $E_c$ can be set equal to each other and to $E$.

If load impedance 24 is assumed to be a resistive load having a value $R_L$, the circuit equation of FIG. 2 is:

$$q^o(1/C_L + 1/C^o) = q(1/C_L + 1/C) + I(R + R_L) \qquad (3)$$

where:

$C_L$ = the capacitance of capacitor 23;
$C$ = the instantaneous capacitance of detector 13, as represented by capacitor 26 in FIG. 2;
$R$ = the instantaneous resistance of detector 13, as represented by resistor 27 in FIG. 2;
$q$ = the instantaneous charge of capacitor 26;
$I = dq/dt$
$q^o$ = the initial charge on the capacitor 26, i.e., the charge applied to detector 13 by D.C. source 18, and
$C^o$ = the static capacitance of detector 13, i.e., the capacitance of capacitor 26 when it is not illuminated by radiation from source 11.

It is convenient to rewrite Equation (3) in the form $$q^o C \left(\frac{1}{C_L} + \frac{1}{C^o}\right) = q + \tau \frac{dq}{dt} + \frac{C}{C_L} q + R_L C \frac{dq}{dt} \qquad (4)$$

where
$\tau$ is the time constant of detector 13;
$\tau$ is independent of time, and is defined as $$\tau \equiv RC = R_o e^{-\frac{E}{kT}} C_o e^{\frac{E}{kT}} = R_o C_o \qquad (5)$$

therefore $\tau$ is also substantially independent of temperature.

The capacitance varies as $$C = \Sigma_m C^{(m)} e^{jm\omega t}; \quad C^{(m)} = C^{(-m)} \qquad (6)$$

where:

$C^{(m)}$ = the capacitance of capacitor 26 for the fundamental and harmonics of the predeterminined chopping frequency.
$\omega$ = the angular frequency of the radiant energy impinging on detector 13 from source 11, whereby $$C^{(1)} = (\alpha_o/2\omega)C^o$$
$$C^{(2)} = (\alpha_o/6\omega)C^o. \qquad (7)$$

$\alpha_o$, a measure of the sensitivity of detector 13, is defined as, $$\alpha_o \equiv -\frac{d\ln C^{-1}}{dT} \cdot \frac{dT(t)}{dt}\bigg]_{t=0}$$
$$= \frac{E}{kT_o} \cdot \frac{P_o}{C_v v T_o} \qquad (8)$$

$T_o$ = ambient temperature of detector 13, i.e., the temperature to which the detector is heated by heater 27,
$P_o$ = the magnitude of the incident radiation power from source 11 on detector 13, $C_v$ = the heat capacity per unit volume of dielectric 14, and $\nu$ = the effective volume of dielectric 14 that must be heated to modulate the dielectric properties.

The solution of the differential equation, Eq. (4), can be expressed as a Fourier series $$q(t) = \sum_{n=\infty}^{\infty} q_n(\omega) e^{in\omega t}; \quad q_n = q_{-n}^* \qquad (9)$$

The signal voltage can also be Fourier expanded with the magnitude of the first harmonic given by $$V_{s1} = \frac{a_o C^{(o)} R_L V}{[(1 + \frac{C^{(o)}}{C_L})^2 + \omega^2(\tau + R_L C^{(o)})^2]^{\frac{1}{2}}} \qquad (10)$$

$V_{s1}^{(\omega)}$ has its maximum value for any fixed frequency $\omega$ in the limits, $$\frac{C^{(o)}}{C_L} << 1, R_L >> R, \text{ and } \omega R_L C^{(o)} >> 1, \text{ and is}$$

$$V_{s1}(\omega)_{max} = \frac{a_o V}{\omega} \qquad (11)$$

If a device with a flat frequency response, rather than a maximum response at the chopping frequency, is wanted then $\omega R_L C^{(o)}$ should be made as small as possible.

one device that has actually been constructed from LaF$_3$ has the following parameters:

| | | |
|---|---|---|
| $T_o = 300°K$ | , | $A = 0.5$ cm$^2$ = sample area at right angles to rays from source 11 |
| $L = 100\mu$ = thickness of dielectric 14 between electrodes 15 & 16 | , | $R_o = 3.0 \times 10^5 \Omega$ |
| $C_o = 2 \times 10^{-8}$ farads | , | $\tau = 6.0 \times 10^{-3}$ sec |
| $C_\nu = 0.4$ (joules/° K-cm$^3$) | , | $\nu = 5 \times 10^{-3}$ cm$^3$ |
| $E = 0.5$ eV | | $\frac{E}{kT} = 20$ |
| Voltage of source 18 = 3 volts | , | $\omega = 2\pi \times 100 = 6.3 \times 10^3$ (rad/sec) |
| $R_L = 100$ K$\Omega$ | , | $a_o = 33.0 P_o$ sec$^{-1}$ |

Given these parameters, the maximum signal voltage is predicted to be $$V_{1s\ max} = 0.16 P_o \qquad (12)$$

While the observed signal was approximately 40% below the predicted value, the difference can be attributed to the black layer being too thick in the device that was actually constructed.

For the dielectrics employed with the present invention, capacitance is independent of the sample thickness so if the area is reduced to $A = 10^{-1}$ cm$^2$ and the thickness to $L = 5$ then those parameters that are size dependent change to:

| | |
|---|---|
| $A = 10^{-1}$ cm$^2$ | $L = 5\mu$ |
| $R = 7.5 \times 10^4 \Omega$ | $C = 2 \times 10^{-9}$ f |
| $\tau = 1.5 \times 10^{-4}$ sec. | $\nu = 5 \times 10^{-5}$ cm$^3$ |
| $a_o = 3.3 \times 10^3 P_o$ | |

$$V_{1s} = 16 P_o \qquad (13)$$

If $\omega$ is decreased to $2\pi \times 10$ then $$V_{1s\ max} = 1.6 \times 10^2 P_o \qquad (14)$$

Thus a 10$^{-1}$cm$^2 \times 5\mu$ LaF$_3$ device operating at 10 Hz derives a signal voltage of approximately $1.6 \times 10^{-5}$ volts for a signal input power of $P_o = 10^{-7}$ watts. For the impedance levels in the device of the invention, noise voltages are generally far smaller than $10^{-5}$ volts, so input powers far smaller than $10^{-7}$ watts should be detectable. The device noise is dominated by Johnson noise; since $R << R_L$ $$V_n = (4kTR\Delta f)^{\frac{1}{2}} \qquad (15)$$

The detectivity is $$D^* = \frac{V_s}{V_n} \cdot \frac{(\Delta f)^{\frac{1}{2}} A^{\frac{1}{2}}}{P_o} = \frac{E}{kt} \cdot \frac{A^{\frac{1}{2}}}{C_\nu T} \cdot \frac{V}{\omega} \cdot \frac{1}{(4kTR)1/2} \qquad (16)$$

For a $10^{-1}$cm$^2 \times 5\mu$ detector operating at room temperature (approximately 300° K) the detectivity $D^* \simeq 1.5 \times 10^9$ (Hz$^{\frac{1}{2}}$cm/watt), a value higher than prior art pyroelectric detectors without the noise problems inherent in a piezoelectric device. A detector operating at 400° K would have a $D^*$ of about $5 \times 10^9$ (Hz$^{\frac{1}{2}}$cm/watt), a value considerably higher than the prior art pyroelectric detectors.

In accordance with a further aspect of the invention, a pyroelectric device is provided for solar to electric energy conversion. In the solar energy converter of FIG. 3, solar energy alternately illuminates a pair of pyroelectric cells 31 and 32 so that the cells are alternately heated and cooled at phases displaced from each other by 180°. Cells 31 and 32 preferably include the same class of dielectrics as specified for the detector of FIG. 1. However, it is to be understood that the solar energy conversion device is, in principle, applicable to any pyroelectric device. The rare earth trifluorides and trichlorides, specified supra, are preferred over other materials as the dielectric for cells 31 and 32 because they have a gain parameter, $\beta = E/kT$, of approximately 20, which provides a relatively high thermal efficiency in converting solar energy to electric energy. Further, there is no change in state, from ferroelectric to nonferroelectric, of these materials in response to the solar radiation. Because no change in state occurs, the capacitors of cells 31 and 32 have no tendency for the cells to crack in response to the cyclic heating and cooling of the cells. Also, if lanthanum trifluoride is employed as the dielectric, it is preferable to employ copper as the electrodes for cells 31 and 32 because copper and lanthanum trifluoride have approximately the same temperature coefficient of expansion, whereby mechanical stability over the relatively wide cyclic temperature variations is achieved.

By alternately illuminating cells 31 and 32 so that one of the cells is illuminated while the other cell is not responsive to the solar energy, efficiency of the solar energy converter is enhanced because the modulation process for the cells does not result in blocking one half of the solar energy from the cell arrangement. To achieve the alternate illumination of cells 31 and 32, the cells are mounted in side by side position in evacuated Dewar 33 and are illuminated through window 34 by solar energy reflected from oscillating mirror 35 that periodically wobbles at frequency $f$, about pivot point 36, in response to being driven by a motor (not shown). Mirror 35 is positioned to be responsive to solar radiation focused on it by collecting lens 37, that is in turn positioned to be responsive to radiation from the sun. In response to the alternate heating and cooling of cells 31 and 32 by the solar radiation reflected from mirror 35, the resistance and capacitance of cells 31 and 32 are correspondingly modulated to deliver power to a pair of load circuits, one of which is provided for each of the cells. Power derived from the two load circuits can be summed together utilizing conventional transformer circuitry. Efficiency of the device is maximized by making the ratio of the illuminated area of lens 37 to the illuminated area of each of cells 31 and 32 as large as possible.

To achieve maximum transfer of current from cells 31 and 32, the cells are preferably connected to a matched load impedance through a resonant circuit. A preferred configuration for one of the cells and its resonant circuit is illustrated in FIG. 4, wherein cell 31 is illustrated as including a dielectric slab 41, preferably of lanthanum trifluoride, as well as a pair of thin metal copper electrodes 42 and 43 on opposite faces of dielectric 41. Coated on electrode 43 is a layer 44 that absorbs the entire spectrum of radiant energy from the sun. Preferably, layer 44 is a layer of black radiation absorbing paint that is coated on the surface of electrode 43.

Cell 31 is initially charged to the voltage, V, of D.C. source 45 by a circuit provided through double pole, single throw switch 46 and current limiting resistor 47. The voltage of D.C. source 45 is selected in accordance with the same criteria mentioned above with regard to the selection of the voltage of source 18 in FIG. 1.

After dielectric 41 has been charged by the voltage of source 45 and while cell 31 is being periodically illuminated by solar radiation, switch 46 is activated to disconnect source 45 from cell 31 and to connect load circuit 48 in series with the cell. Load circuit 48 includes a d.c. blocking capacitor 49 that prevents the charge on cell 31 from discharging into the remainder of the load circuit which consists of a series inductance 50 and resistive load impedance 51. Blocking capacitor 49 has a value much larger than the static capacitance of detector 31, while inductor 50 is selected to have an inductance necessary to resonate the series circuit at the illumination frequency, $f$, of cell 31, for the static capacitance of the cell. In particular, the value of inductance 50 is selected in accordance with:

$$L = \frac{C^o + C_L}{\omega^2 C^o C_L} \doteq \frac{1}{\omega^2 C^o} \text{ for } C_L >> C^o \quad (17)$$

where:
$C^o$ = the static capacitance of detector 31,
$C_L$ = the capacitance of blocking capacitor 49, and
$\omega = 2\pi f$ To achieve maximum power transfer to load impedance 51, cell 31 is matched to the load circuit, whereby the static resistance of cell 31 equals the sum of the resistances of inductor 50 and impedance 51.

In FIG. 5, there is illustrated an equivalent circuit for the fundamental frequency of the device illustrated in FIG. 4. The equivalent circuit diagram of FIG. 5 differs from that of FIG. 2 because FIG. 5 includes an a.c. source 54 connected in series with a variable capacitor 55 and variable resistor 56 which together represent the impedance of cell 31. Load circuit 48 is represented by the series connection of capacitor 49, inductor 50 and load resistance 51.

If one supposes that the power delivered to the load and the power dissipated in the device are both at the fundamental frequency and exactly out of phase with the modulated radiation, then the analysis simplifies considerably. For a given set of parameters this approximation yields a lowerlimit for the efficiency. Then the voltage, $V_s$, of source 54 is given by the expression $$V_s = \left(\frac{E}{kT}\right) \frac{\rho - P_T}{C_V l T} V \frac{\lambda_T}{\sqrt{1 + \omega^2 \lambda_T^2}} \quad (18)$$

$$V_{s_{lim(\omega\tau_T)^2 >> 1}} = \left(\frac{E}{kT}\right) \frac{\rho - P_T}{C_V l T} \frac{V}{\omega}$$

where $\rho$ is the average solar power per unit area absorbed by black layer 44, $P_T$ is the total peak power generated by cell 31, $C_V$ is the specific heat per unit volume of the cell dielectric 41, $l$ is the thickness of the cell dielectric 41 between electrodes 42 and 43, T is the ambient temperature of cell 31 in K°, E is the activation energy that determines the thermal variation of the capacitance, $C = C_o e^{-E/kT}$, and $\tau_T$ is the thermal relaxation time of cell 31.

The quantity $\rho$ is related to the solar flux $\rho_o$ incident on dielectric 41 by $$\rho = \frac{\eta \rho_o}{2} \frac{A_1}{A} \quad (19)$$

where:
$\eta$ = the absorption coefficient of black layer 44,
$A_1$ = area of collecting lens 37 at right angles to the solar energy incident thereon,
$A$ = area of dielectric 41 at right angles to the solar energy incident thereon.

With L and $R_L$ chosen as indicated supra so maximum power is delivered to load 51, the peak power per unit area, $P = \frac{1}{2}P_T$, delivered by cell 31 to load 51 is $$P = \frac{V_s^2}{4(AR)} = \frac{1}{4AR} \left(\frac{E}{kT} \frac{V}{C_V l T \omega}\right)^2 (\rho - 2P)^2 \quad (20)$$

The ($\frac{1}{2}$) factor occurs because cell 31 is illuminated only one half of the time. The efficiency of the device e, defined as the ratio of the power delivered to the load to the radiant power incident on the device, is found by solving Equation (20) and is given $$e \equiv \frac{P}{\frac{\rho_o}{2} \frac{A_1}{A}} = \frac{\eta}{2} \left[1 + \frac{1}{4\epsilon} - \frac{\sqrt{(1 + \frac{1}{4\epsilon})^2 - 1}}{}\right] \quad (21)$$

where dimensionless parameter $\xi$ is defined by $$\epsilon = \frac{1}{4(AR)} \left(\frac{E}{kT} \frac{V}{C_V T \omega}\right)^2 \frac{\eta p_o}{2} \frac{A_1}{A} \quad (22)$$

Note that the product AR (which is desirably minimized to maximize the peak power P) is independent of area, and the maximum value of $e$ is $\eta/2$ corresponding to ½ of the absorbed radiation power being delivered to load circuit 48 and the other ½ being dissipated in the resistance of cell 31.

Next examine the physical effects that limit the various parameters.

(a) The largest initial voltage V that can be applied to cell 31 is limited by the breakdown voltage of dielectric 41, which for LaF$_3$ is about 5 volts.

(b) The thinnest sample that would be useful is limited both by structural considerations and by the thickness of the space charge layer that causes the large effective capacitance of pyrionic materials. The space charge layers are about 1 to 2$\mu$ thick. The thinnest structure that might be self supporting in a waffle configuration is about 5$\mu$ thick in the thin regions and about 20$\mu$ in the thick regions. Such structures can be fabricated by ion milling. Thus both effects limit $l$ to $l = 5\mu$. However, to optimize the power per unit area generated by the cell $l \sim 50 \rightarrow 120\mu$ will actually be used. For such thicknesses there is no fabrication problem.

(c) The resistance R is an exponential function of temperature below $\sim 400°$ K and tends to saturate above that temperature.
In addition $C_V$ starts to increase at temperatures approaching 650° K since that temperature characterizes optical vibration modes of LaF$_3$. Thus for several reasons an ambient operating temperatures of 400° K is preferable and is achieved by placing cells 31 and 32 in enclosed evacuated Dewar 33, having a heater 38 to cause cells 31 and 32 to reach an ambient temperature of 400° K and to maximize the thermal time constant for the a.c. operation of the device. At a 400° K ambient temperature, the product AR = 6 $\Omega$ − cm$^2$ for LaF$_3$. At 300° K the product increases to AR = 600 $\Omega$ − cm$^2$. It may be possible to decrease the AR product still further by doping a LaF$_3$ crystal with O$_2$ or some other divalent atom.

(d) The maximum thermal time constant $\tau_T$ is limited by radiative interactions of the solar energy with the inside walls of Dewar 33. This time constant is given by $$\tau_T = \frac{C_V l}{8\epsilon \alpha_{SB} T^3} \quad (23)$$

where $\epsilon$ is the emissivity of the walls, and $\alpha_{SB}$ is the Stephan-Boltzmann constant, $\alpha_{SB} = 5.7 \times 10^{-12}$ watts/(cm$^2$−(°K)$^4$). For $$C_V = 0.4 \frac{\text{joules}}{\text{cm}^3 - °K},$$

$l = 5\mu$, T = 400° K and $\epsilon = \frac{2}{3}$, $\tau_T = 0.1$ sec. The restriction $(\omega \tau_T)^2 >> 1$ then requires $\omega = 30$ sec$^{-1}$ to be satisfied, whereby maximum efficiency is achieved at a frequency of approximately 5 Hz.

(e) While it may not be essential to the functioning of the device, the analysis in terms of a first harmonic equivalent circuit is only correct if $V_s/V \leq \frac{1}{3}$. This condition places an upper limit on the collector area A$_1$ that can be employed. The restriction is:

$$\frac{A_1}{A} \frac{2C_V T \omega}{3p_o \left(\frac{E}{kT}\right)} + \frac{V^2}{9(AR)p_o \eta} = 6.3 \quad (24)$$

for $\eta = 0.9$.

If all the numbers set forth earlier are placed in Equations (21) and (22) we find $\xi = 10.2$ and a corresponding theoretical efficiency $e = 0.36$, whereby 36% of the incident solar power is converted to electrical power. The preceding analysis presumes that the voltage delivered by cell 31 to the load is in phase with the incident solar energy. More exact calculations I have made indicate that the efficiency can be increased to approximately 50% to 60% because there is a phase shift between the modulation of the incident solar energy and the load voltage, and because the power is mostly in the second harmonic since it is proportional to $v_s^2$. The more exact theory also predicts that $l$ can be increased to 110$\mu$ without deteriorating the efficiency if $A_1/A$ is increased to $\sim 275$. Thus for an efficiency $e = 50\%$, each cell generates about 6.9 watts per square centimeter of surface area (a pair of cells alternately illuminated generate approximately 13 watts/cm$^2$) when illuminated by sunlight at the earth's surface. It is possible to fabricate LaF$_3$ cells with area, A = 20cm$^2$ (A$_1$ = 5500cm$^2$) so a pair will generate approximately 260 watts.

As noted above, the preferred operating efficiency of the solar energy converter is on the order of 5 Hertz. For a typical one of cells 31 or 32, and the 5 Hertz operating frequency, the inductance of inductor 50 necessary to achieve resonance is relatively large. To enable the physical size of an element used for inductance 50 to be reduced, while possibly reducing the power requirements of the inductive reactance, an operational amplifier network having the characteristics of an inductance, but utilizing only capacitors as reactive elements, can be employed.

One operational amplifier arrangement which eliminates the need for inductance 50 is illustrated in FIG. 6 wherein inductance 50 is essentially replaced by a pair of cascaded operational amplifier networks 61 and 62. Operational amplifier networks 61 and 62 respectively include D.C. operational amplifiers 63 and 64 having common input terminals connected to the junction between blocking capacitor 49 and an output electrode of detector 31. Feedback resistors 65 and 66, preferably having equal values (R$_e$), are respectively connected between the output and signal input terminals of amplifiers 63 and 64. The signal input terminals of amplifiers 63 and 64 are also respectively connected to one electrode of capacitors 67 and 68, preferably having equal values (C$_e$). The other electrode of capacitor 67 is connected to an electrode of blocking capacitor 49, while the remaining electrode of capacitor 68 is connected to the output terminal of operational amplifier network 61. The output terminal of operational amplifier network 62 is connected in series with load impedance 51. The voltage across operational amplifier networks 61 and 62 is $$\frac{(R_e C_e)^2}{C_L} \frac{dI}{dt}$$

(where $I$ = the current derived from cell 31) to simulate an inductance having a value $$L = \frac{(R_e C_s)^2}{C_L}$$

The circuit of FIG. 6, in addition to minimizing the power absorbed by a reactance necessary to resonate cell 31 and minimizing inductance volume requirements, enables the inductance value to be easily selected.

Figure 3:
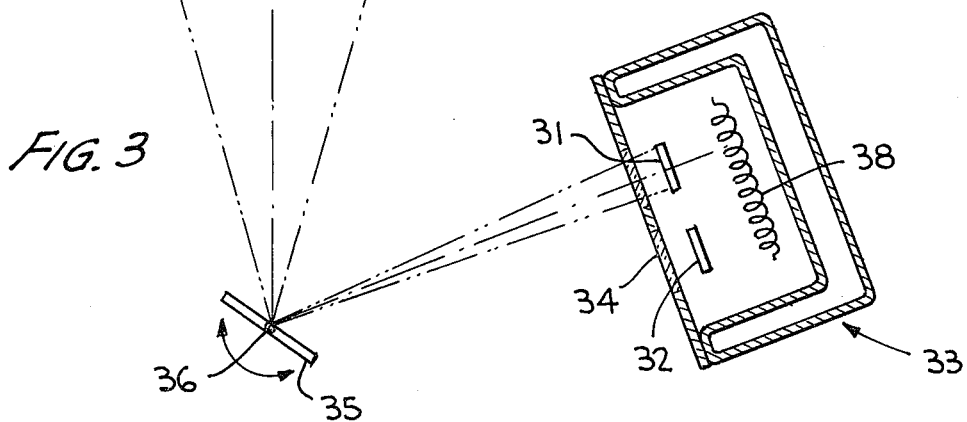
FIG. 3 is a schematic diagram of an embodiment of the invention utilized as a solar cell.

In a practical situation for converting solar energy into electrical energy, a large number of pyroelectric cells are provided and are irradiated by the solar energy with different phases by a reflecting system similar to that of mirror 35. Alternatively, a large number of two cell arrangements, as illustrated in FIG. 3, can be provided, each with its own reflecting mirror.

If multiple cells are provided it is desirable to connect them to a common load, such that the load is attached to the driving impedance of the several cells with a common resonant circuit. In the circuit of FIG. 7, each of a plurality of detectors 71—1, 71—2 . . . 71—N is connected in parallel with each other and the primary winding 72 (having inductance L) of transformer 73. Transformer 73 includes a secondary winding 74 that is connected to a resistive load impedance 75. Preferably each of detectors 71—1, 71—2 . . . 72—N has approximately the same static capacitance and resistance, C and R. With the parallel arrangement of FIG. 7, the total capacitance of the array is approximately equal to NC. The value of resonating inductance (L) of winding 72 for such an array is $$\frac{1}{\omega^2 C_T} = \frac{1}{\omega^2 NC} ;$$

for large values of N, the value of L is relatively easy to satisfy. The resistive impedance of the array ($R_T = R/N$) may be quite low and difficult to match. However, by selecting the turns ratio between the primary and secondary windings 72 and 74 of transformer 73 to equal the number (N) of detectors, the matching condition RL = R is retained. By utilizing conventional transformers, having efficiencies of above 99%, the peak power delivered to load impedance 75 from the array of N cells 71—1, 71—2 . . . 71—N equals NP, whereby the overall efficiency of the array remains approximately the same as calculated supra.

To increase the efficiency of the device, cells 31 and 32 can be placed in reflective housings so that each of the cells is responsive to light energy reflected multiple times within a housing in which the cells are located until all the energy is absorbed by the surface of one of cells 31 or 32.

Figure 8:
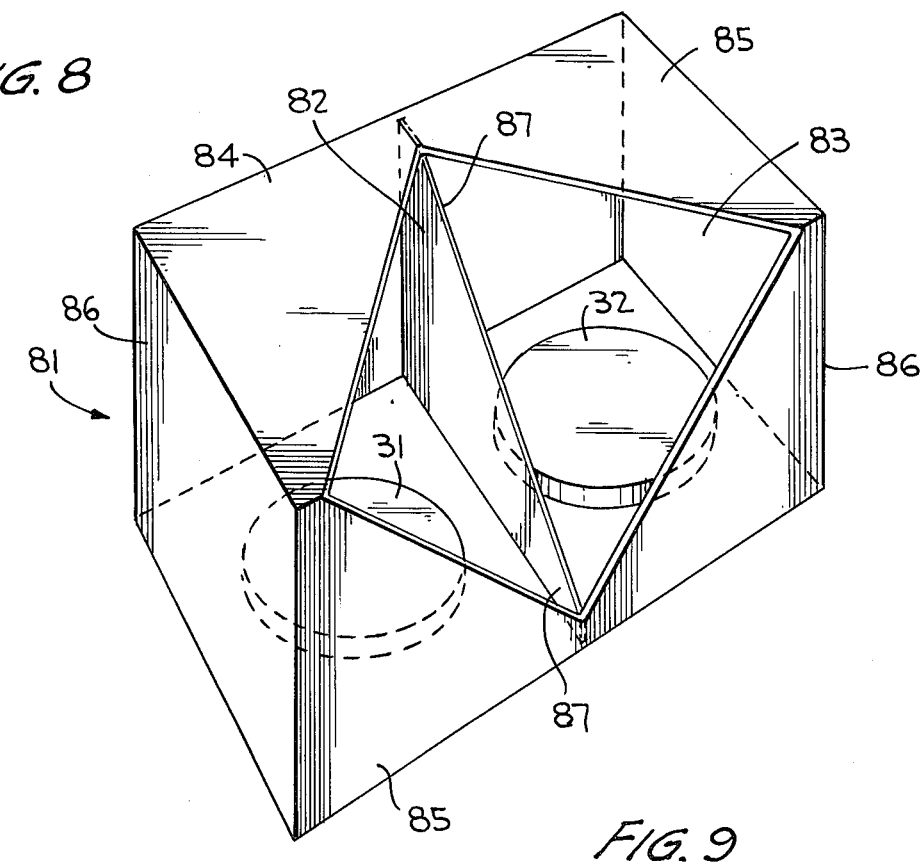
FIGS. 8–10 are views of a preferred housing for the device of FIG. 3.
Figure 9:
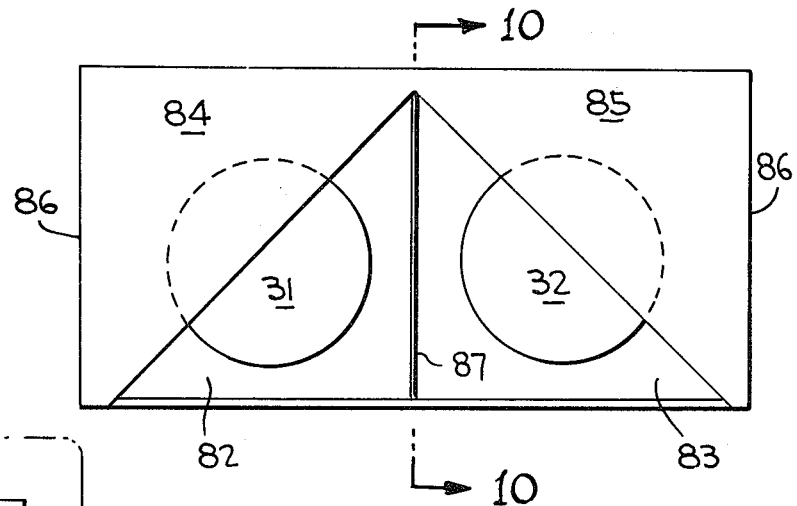
Figure 10:
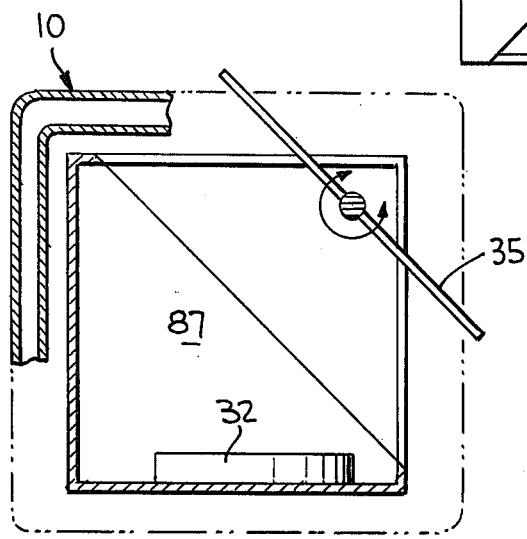

One configuration for enabling solar energy to be directly and multiply reflected onto cells 31 and 32 is illustrated in FIG. 8-10 wherein cells 31 and 32 are located in a common plane within housing 81. Housing 81 has a generally parallelepiped configuration including parallel top and bottom walls 84, parallel front and back walls 85, and parallel side walls 86. The interior of each of walls 84-86 is optically reflecting so that a corner reflector is provided at each intersection of three walls. Intersecting top and front walls 84 and 85 at opposite acute angles are planar, optically transparent windows 82 and 83, having common abutting edges that extend parallel to and approximately midway between end walls 86. Cells 31 and 32 are positioned on bottom wall 84 so that they are respectively responsive to solar radiant energy reflected from pivoting mirror 35, as coupled through windows 82 and 83, as well as energy internally reflected from walls 84-86. Thereby, any solar radiant energy ray passing through windows 82 and 83 is ultimately absorbed by one of detectors 31 or 32, either directly or after multiple reflections from the interior walls of housing 81.

It is to be understood that other optical chambers can provide the multiply reflective solar energy paths to the detectors. For example, window 34, FIG. 3, can be formed as a pair of identical abutting spherical segments, each of which has a center of curvature coincident with the center of one of detectors 31 and 32. The spherical segments are provided with an interior reflecting surface and a relatively small aperture to enable the light reflected from mirror 35 to irradiate cells 31 and 32. Any light incident on the Dewar 33 and not absorbed by one of cells 31 or 32 is reflected back to one of the reflecting spherical surfaces and is ultimately coupled to one of the detectors.

While there have been described and illustrated several specific embodiments of the invention, it will be clear that variations in the details of the embodiments specifically illustrated and described may be made without departing from the true spirit and scope of the invention as defined in the appended claims.

What is claimed is:

1. Apparatus for converting radiant energy into electric energy comprising a capacitor including an ionic dielectric and a pair of electrodes, means for causing said dielectric to be cyclically heated and cooled by said radiant energy, the properties of said dielectric being dominated by a dipole layer only on or near its surface, the capacitance of the capacitor being modulated in response to the cyclic heating and cooling, and means for connecting a load to the electrodes so the load is responsive to current derived from the capacitor in response to the capacitance modulation.

2. The apparatus of claim 1 further including means for heating the dielectric to an ambient temperature such that the series resistance and Johnson noise of the capacitor are decreased while the capacitance of the capacitor is increased.

3. The apparatus of claim 2 wherein the load has an impedance considerably greater than the impedance of the capacitor.

4. The apparatus of claim 1 further including a layer for absorbing the radiant energy, said layer being on an exterior surface of one of the electrodes.

5. The apparatus of claim 1 further including means for initially charging the capacitor to a voltage sufficient to cause a current to flow in the load, said voltage being less than the breakdown voltage of the capacitor dielectric.

6. The apparatus of claim 1 further including an evacuated Dewar in which said capacitor is located, said Dewar including a window transparent to the radiant energy, the window and capacitor being positioned so that the radiant energy can illuminate the capacitor.

7. The apparatus of claim 6 further including means for raising the ambient temperature of the capacitor.

8. Apparatus for converting radiant energy into electric energy comprising a capacitor including an ionic dielectric and a pair of electrodes, means for causing said dielectric to be cyclically heated and cooled by said radiant energy, said dielectric being selected from the group consisting of the rare earth trifluorides and trichlorides, the capacitance of the capacitor being modulated in response to the cyclic heating and cooling, and means for connecting a load to the electrodes so the load is responsive to current derived from the capacitor in response to the capacitance modulation.

9. The apparatus of claim 8 wherein said dielectric comprises single crystal lanthanum trifluoride.

10. The apparatus of claim 8 further including means for initially charging the capacitor to a voltage sufficient to cause a current to flow in the load, said voltage being less than the breakdown voltage of the capacitor dielectric.

11. The apparatus of claim 8 further including an evacuated Dewar in which said capacitor is located, said Dewar including a window transparent to the radiant energy, the window and capacitor being positioned so that the radiant enerby can illuminate the capacitor.

12. The apparatus of claim 11 further including means for raising the ambient temperature of the capacitor.

13. Apparatus for converting radiant energy into electric energy comprising a capacitor including an ionic dielectric and a pair of electrodes, means for causing said dielectrice to be heated by the radiant energy, the properties of said dielectric being dominated by a dipole layer only on or near its surface, the capacitance of the capacitor being modulated in response to the heating, and means for connecting a load to the electrodes so the load is responsive to current derived from the capacitor in response to the capacitance modulation.

14. The apparatus of claim 13 further including means for initially biasing the capacitor to a voltage sufficient to cause a current to flow in the load without breaking down the capacitor dielectric.

15. The apparatus of claim 13 further including means for heating the dielectric to an ambient temperature such that the series resistance and Johnson noise of the capacitor are decreased while the capacitance of the capacitor is increased.

16. The apparatus of claim 13 further including an evacuated Dewar in which said capacitor is located, said Dewar including a window transparent to the radiant energy, the window and capacitor being positioned so that the radiant energy can illuminate the capacitor.

17. The apparatus of claim 16 further including means for raising the ambient temperature of the capacitor.

18. Apparatus for converting radiant energy into electric energy comprising a capacitor including an ionic dielectric and a pair of electrodes, means for causing the dielectric to be heated by the radiant energy, said dielectric being selected from the group consisting of the rare earth trifluorides and trichlorides, the capacitance of the capacitor being modulated in response to the heating, and means for connecting a load to the electrodes so the load is responsive to current derived from the capacitor in response to the capacitance modulation.

19. The apparatus of claim 18 further including means for initially charging the capacitor to a voltage sufficient to cause a current to flow in the load, said voltage being less than the breakdown voltage of the capacitor dielectric.

20. The apparatus of claim 18 further including means for heating the dielectric to an ambient temperature such that the series resistance and Johnson noise of the capacitor are decreased while the capacitance of the capacitor is increased.

21. The apparatus of claim 18 further including an evacuated Dewar in which said capacitor is located, said Dewar including a window transparent to the radiant energy, the window and capacitor being positioned so that the radiant energy can illuminate the capacitor.

22. The apparatus of claim 21 further including means for raising the ambient temperature of the capacitor.

23. A method of converting radiant energy into electric energy comprising illuminating a capacitor having an ionic dielectric with a source of the radiant energy so that the capacitor absorbs the energy and is heated by the absorbed energy, the properties of said dielectric being dominated by a dipole layer only on or near its surface, the capacitance of the capacitor thereof being modulated in response to the heating, and connecting a load to the electrodes so the load is responsive to current derived from the capacitor in response to the capacitance modulation.

24. The method of claim 23 further including heating the dielectric to an ambient temperature of approximately 400° K.

25. The method of claim 24 wherein the capacitor is cyclically heated by the radiant energy so that the capacitor is alternately heated and cooled.

26. The method of claim 23 wherein the capacitor is cyclically heated by the radiant energy so that the capacitor is alternately heated and cooled.

27. A method of converting radiant energy into electric energy comprising illuminating a capacitor having an ionic dielectric with a source of the radiant energy so that the capacitor absorbs the energy and is heated by the absorbed energy, said dielectric being selected from the group consisting of the rare earth trifluorides and trichlorides, the capacitance of the capacitor thereof being modulated in response to the heating, and connecting a load to the electrodes so the load is responsive to current derived from the capacitor in response to the capacitance modulation.

28. The method of claim 27 further including heating the dielectric to an ambient temperature of approximately 400° K.

29. The method of claim 28 wherein the capacitor is cyclically heated by the radiant energy so that the capacitor is alternately heated and cooled.

30. The method of claim 27 wherein the capacitor is cyclically heated by the radiant energy so that the capacitor is alternately heated and cooled.

* * * * *